(12) United States Patent
Rosèn et al.

(10) Patent No.: US 10,724,658 B2
(45) Date of Patent: Jul. 28, 2020

(54) METHOD FOR MANUFACTURING A TUBE OF METAL AS WELL AS A TUBE OF METAL

(71) Applicant: Sandvik Materials Technology Deutschland GmbH, Düsseldorf (DE)

(72) Inventors: Jonas Rosèn, Sandviken (SE);
Christofer Hedvall, Bielefeld (DE);
Udo Rauffmann, Werther (DE);
Thomas Froböse, Versmold (DE);
Leandro Finzetto, Katy, TX (US);
Jonas Gynnerstedt, Järbo (SE); Erika Hedblom, Valbo (SE)

(73) Assignee: Sandvik Materials Technology Deutschland GmbH, Düsseldorf (DE)

( * ) Notice: Subject to any disclaimer, the term of this patent is extended or adjusted under 35 U.S.C. 154(b) by 66 days.

(21) Appl. No.: 16/061,370

(22) PCT Filed: Nov. 16, 2016

(86) PCT No.: PCT/EP2016/077810
§ 371 (c)(1),
(2) Date: Jun. 12, 2018

(87) PCT Pub. No.: WO2017/102227
PCT Pub. Date: Jun. 22, 2017

(65) Prior Publication Data
US 2018/0356009 A1    Dec. 13, 2018

(30) Foreign Application Priority Data

Dec. 18, 2015   (DE) .................. 10 2015 122 295

(51) Int. Cl.
*F16L 9/02*    (2006.01)
*B21C 37/15*    (2006.01)
(Continued)

(52) U.S. Cl.
CPC .............. *F16L 9/02* (2013.01); *B21C 3/04* (2013.01); *B21C 3/16* (2013.01); *B21C 37/154* (2013.01);
(Continued)

(58) Field of Classification Search
CPC .......... F16L 9/02; F16L 9/18; F16L 2201/30; B21C 3/04; B21C 3/16; B21C 37/154;
(Continued)

(56) References Cited

U.S. PATENT DOCUMENTS 4,133,972 A * 1/1979 Andersson ............ F16L 11/127
138/125
4,216,575 A    8/1980 Carnavos et al.
(Continued)

FOREIGN PATENT DOCUMENTS

CH    386190 A    12/1964
CN    1214637 A    4/1999
(Continued)

OTHER PUBLICATIONS

Office Action dated May 21, 2019, issued in corresponding Chinese Patent Application No. 201680074307.3.
(Continued)

*Primary Examiner* — Craig M Schneider
*Assistant Examiner* — David R Deal
(74) *Attorney, Agent, or Firm* — Morgan, Lewis & Bockius LLP

(57) ABSTRACT

Method for manufacturing a tube of metal in which sensors are attached to tubes, which register and signal a damage of the tube. It is detrimental that protection of the sensors at these tubes against environmental influences is complex. In contrast, it is an object of the present disclosure to provide a method for manufacturing a tube, in which the signal line can be protectively mounted. To solve this object, a method for manufacturing a tube of metal is suggested with an outer (Continued)

tube and an inner tube, wherein a groove is drawn in an inner surface of the outer tube or in an outer surface of the inner tube and subsequently the inner tube and the outer tube are drawn together through a drawing die, wherein the inner dimension of the outer tube is reduced such that after the drawing the outer tube is force-fitted onto the inner tube.

18 Claims, 10 Drawing Sheets

(51) Int. Cl.
*B21C 3/04* (2006.01)
*B21C 3/16* (2006.01)
*B21C 37/20* (2006.01)
*H05K 3/10* (2006.01)
*F16L 9/18* (2006.01)
*G01M 3/18* (2006.01)
*G01M 5/00* (2006.01)

(52) U.S. Cl.
CPC .............. *B21C 37/202* (2013.01); *F16L 9/18* (2013.01); *H05K 3/107* (2013.01); *F16L 2201/30* (2013.01); *G01M 3/182* (2013.01); *G01M 5/0025* (2013.01); *G01M 5/0033* (2013.01)

(58) Field of Classification Search
CPC ..... B21C 37/202; H05K 3/107; G01M 3/182; G01M 5/0025; G01M 5/0033
USPC ........................................................ 138/114
See application file for complete search history.

(56) References Cited

U.S. PATENT DOCUMENTS

| | | | | |
|---|---|---|---|---|
| 4,934,579 A * | 6/1990 | Doble | ................ | B23K 20/021 228/127 |
| 5,857,921 A | 1/1999 | Braly et al. | | |
| 5,881,946 A | 3/1999 | Cürten et al. | | |
| 5,921,285 A * | 7/1999 | Quigley | .................... | D04C 1/06 138/125 |
| 7,042,235 B2 | 5/2006 | Strackbein et al. | | |
| 7,431,053 B2 * | 10/2008 | Suzuki | ....................... | F16L 9/19 138/111 |
| 7,650,724 B2 * | 1/2010 | Hallett | ..................... | A47C 5/04 114/361 |
| 9,010,439 B2 * | 4/2015 | Fogg | ....................... | H01B 7/045 166/344 |
| 9,091,487 B2 * | 7/2015 | Byon | ....................... | F28D 7/106 |
| 9,228,428 B2 * | 1/2016 | Sipila | .................. | E21B 47/0006 |
| 9,396,840 B2 * | 7/2016 | Mizutani | .............. | H02G 3/0481 |
| 2009/0139596 A1 * | 6/2009 | Kuyl | ......................... | F16L 9/19 138/148 |
| 2010/0032042 A1 * | 2/2010 | Baur | ..................... | F16L 11/121 138/33 |
| 2014/0345742 A1 * | 11/2014 | Andreychuk | ............. | F16L 9/02 228/144 |

FOREIGN PATENT DOCUMENTS

| | | |
|---|---|---|
| CN | 102632102 A | 8/2012 |
| CN | 103157694 A | 6/2013 |
| CN | 204817505 U | 12/2015 |
| DE | 3706408 C1 | 5/1988 |
| DE | 4039863 C1 | 2/1992 |
| DE | 9110188 U1 | 2/1992 |
| FR | 2524110 A1 | 9/1983 |
| GB | 728131 A | 4/1955 |
| GB | 960628 A | 6/1964 |
| GB | 2117281 B | 1/1986 |
| JP | H08150412 A | 6/1996 |
| JP | H10156430 A | 6/1998 |
| WO | 98/22769 A1 | 5/1998 |
| WO | 2007/120642 A2 | 10/2007 |

OTHER PUBLICATIONS

International Search Report and Written Opinion dated Feb. 6, 2017, issued in International Patent Application No. PCT/EP2016/077810.
Office Action dated Mar. 2, 2020, issued in European Patent Application 16797863.4.

* cited by examiner

METHOD FOR MANUFACTURING A TUBE OF METAL AS WELL AS A TUBE OF METAL

The present disclosure relates to a method for manufacturing a tube of metal as well as to a tube of metal.

Tubes of metal, in particular of stainless steel, are used in a plurality of applications wherein the tubes are subject to multiple stresses. These stresses may for example lead to pipe bursts, which not only lead to a replacement of the respective tube, but also to considerably increased costs. In some cases sensors are therefore attached to these tubes, which will indicate and also send a signal when a damage appears in the tube. However, it turned out to be complex to protect the sensors in these tubes against environmental influences.

In contrast, it is an aspect of the present disclosure to provide a method for manufacturing a tube of metal as well as a tube of metal, in which at least one signal line can be protectively located.

To solve this aspect, a method according to the present disclosure is suggested for manufacturing a tube of metal, wherein the tube has an outer surface and an inner surface, the method comprising the steps of: providing an outer tube of metal with an outer surface, an inner surface, an inner dimension and an outer dimension, providing an inner tube of metal with an outer surface, an inner surface, an outer dimension and an inner dimension, wherein at least providing the outer tube comprises the steps: providing a hollow of metal, drawing the hollow of metal through a first drawing die with an inner tool surface forming the outer surface of the outer tube and over a mandrel with an outer tool surface forming the inner surface of the outer tube into the outer tube, wherein a tool dimension of the inner tool surface of the first drawing die and a tool dimension of the outer tool surface of the mandrel are chosen such that the inner dimension of the outer tube is larger than the outer dimension of the inner tube, and wherein the outer tool surface of the mandrel comprises at least one section projecting outwardly such that a groove is drawn in the inner surface of the outer tube extending in a longitudinal direction of the outer tube, or wherein providing the inner tube comprises the steps: providing a hollow of metal, drawing the hollow of metal through a second drawing die with an inner tool surface forming the outer surface of the inner tube into the inner tube, wherein the tool dimension of the inner tool surface of the second drawing die is chosen such that the outer dimension of the inner tube is smaller than the inner dimension of the outer tube, and wherein the inner tool surface of the second drawing die comprises at least one section projecting inwardly such that a groove is drawn in the outer surface of the inner tube extending in a longitudinal direction of the inner tube, inserting the inner tube into the outer tube, such that the inner tube extends in the outer tube, and drawing the inner tube and the outer tube together through a third drawing die with an inner tool surface forming the outer surface of the outer tube, wherein a tool dimension of the inner tool surface of the third drawing die is chosen such that by drawing the inner dimension of the outer tube is reduced such that after the drawing the outer tube is force-fitted onto the inner tube.

It turned out that by this method a tube with an outer tube and an inner tube of metal can be manufactured, in which a signal line or even a signal line with at least one sensor is integrable.

In an embodiment of the disclosure, the outer tube and/or the inner tube are manufactured of a metal chosen from a group consisting of steel, carbon steel, stainless steel, manganese steel, a nickel based alloy, aluminium (Al), Al-based alloy, copper (Cu), Cu-based alloy, zirconium (Zr), Zr-based alloy, titanium (Ti), Ti-based alloy, an iron-chromium-aluminium (FeCrAl) alloy, ferritic steel or any combination thereof. It shall be understood that the hollows, which are used to provide or manufacture the outer tube or the inner tube, in an embodiment are made of a metal chosen from a group consisting of steel, carbon steel, stainless steel, manganese steel, a nickel based alloy, Al, Al-based alloy, Cu, Cu-based alloy, Zr, Zr-based alloy, Ti, Ti-based alloy, an iron-chromium-aluminium a FeCrAl alloy, ferritic steel or any combination thereof. It shall be understood that generally the material of the outer tube and/or the inner tube may be chosen independently from each other.

While in an embodiment of the present disclosure the outer tube and the inner tube consist of an identical material, in an alternative embodiment the outer tube and the inner tube comprise materials being different from each other. The latter is advantageous in that different properties of the materials for the outer tube and for the inner tube may be provided, which can be combined arbitrarily in order to obtain a tube being adopted for a particular application.

In an embodiment of the disclosure, the steps of inserting the inner tube into the outer tube and of drawing of the inner tube and the outer tube together through a third drawing die are carried out in the exact given order, i.e. after each other. In contrast there is no particular order being relevant for the present disclosure for providing the outer tube and for providing the inner tube.

Generally, the inner tube and the outer tube may have different cross sections, e.g. circular, quadratic, triangular or generally polygonal. Upon providing the outer tube or the inner tube, for example by forming a hollow into the outer tube or into the inner tube, respectively, in an embodiment simultaneously a definition of the cross sectional surface of the tube may be achieved.

For example for a quadratic or rectangular tube, the outer dimension and the inner dimension are the side length of the quadrangle or the side length of the rectangle, which define the inner cross section or the outer cross section of the tube. The wall thickness is the difference between the respective outer dimension and the associated inner dimension. For a circular tube, the outer dimension is the outer diameter of the respective tube and the inner diameter is the inner dimension of the respective tube. The wall thickness of a circular tube is the difference between the outer radius and the inner radius.

It is crucial for the method for manufacturing according to the disclosure that the outer tube provided comprises an outer dimension being matched to the inner dimension of the inner tube provided, such that the inner tube can be inserted into the outer tube with comparatively low forces in order to mount the tube of the outer tube and the inner tube.

In an embodiment, the outer tube and the inner tube are essentially hollow cylindrical, such that they comprise a circular cross section. In such an embodiment, the inner tool surfaces of the first, second and third drawing dies comprise an essentially conical shape and the section of these conus having the smaller cross sectional diameter defines the tool dimension of the respective drawing die.

It is essential in order to be able to provide a tube having an integrated sensor and/or an integrated signal line, that a signal line, in an embodiment at least a signal line and at least a sensor, may be accommodated between the outer tube and the inner tube. In order to do so in an embodiment of the disclosure during forming of a hollow into the outer tube or into the inner tube by drawing a groove is drawn either in the inner surface of the outer tube or in the outer surface of the inner tube or even in both. It shall be understood that this groove extends in the longitudinal direction of the tube and thus provides at least the space for a signal line.

When a groove is drawn in the inner surface of the outer tube, this drawing process is carried out by a first drawing die whose inner tool surface forms the outer surface of the outer tube and a mandrel whose outer tool surface forms the inner surface of the outer tube. In such an embodiment, the outer tool surface of the mandrel comprises at least one section projecting radially outwardly, such that during the drawing this section draws the groove in the inner surface of the outer tube.

In contrast, the drawing of a hollow of metal through a drawing die, which in the sense of the present application is denoted as the second drawing die, into the inner tube in an embodiment of the disclosure may be performed without a mandrel. If a groove for a signal line is to be provided in an outer surface of the inner tube, the inner tool surface of the second drawing die defining the outer surface of the inner tube must comprise a section projecting inwardly such that a groove extending in a longitudinal direction of the inner tube is drawn in the outer surface of the inner tube.

While in an embodiment of the disclosure exactly one groove is provided in the inner surface of the outer tube and/or in the outer surface of the inner tube a plurality of grooves may alternatively be drawn in the outer tube or in the inner tube. It shall be understood that in such an embodiment, the outer tool surface of the mandrel for locating the grooves in the inner surface of the outer tube comprises a corresponding number of sections projecting outwardly. In an embodiment, exactly three grooves are drawn in the inner surface of the outer tube. In an embodiment, these grooves have a distance in a circumferential direction of about 120° from each other.

Equally, for a plurality of grooves provided in the outer surface of the inner tube, the inner tool surface of the second drawing die comprises a plurality of sections projecting inwardly. In an embodiment exactly three grooves are drawn in the outer surface of the inner tube. In an embodiment these grooves have a distance in a circumferential direction of about 120° from each other.

By drawing the inner tube and the outer tube together through the third drawing die, wherein the third drawing die has an inner tool surface defining the outer surface of the tube, the outer tube and the inner tube are force-fittingly joined together to form the tube to be manufactured. In order to provide the force-fit between the outer tube and the inner tube, the tool dimension of the inner tool surface of the third drawing die must be smaller than the outer dimension of the outer tube fed into the third drawing die. During deformation in the third drawing die, the outer tube must be formed such that its inner dimension is reduced in order to provide a force-fit between the outer tube and the inner tube.

To provide this force-fit, the outer dimension and the inner dimension of the outer tube prior to the drawing through the third drawing die, the outer dimension and the inner dimension of the inner tube prior to the drawing through the third drawing die as well as the tool dimension of the inner tool surface of the third drawing die must be matched with respect to each other. In doing so the common drawing of the outer tube and the inner tube together through the third drawing die can be denoted as drawing of the outer tube through the third drawing die and over or onto a mandrel which is formed by the inner tube.

In an embodiment of the disclosure, the tool dimension of the inner tool surface of the third drawing die is equal to the outer dimension of the inner tube fed into the third drawing die, i.e. prior to the drawing through the third drawing die, plus double the wall thickness of the outer tube fed in, i.e. prior to the drawing of the outer tube through the third drawing die, and minus a reduction value, wherein the reduction value amounts to at least 0.05 mm. This way a sufficient force-fit is provided by reduction of the dimensions of the outer tube. In an embodiment of the disclosure the reduction value amounts to at least 0.1 mm and in a further embodiment to at least 0.15 mm.

Expressed as a formula the relation between the outer dimension $AD_i$ of the inner tube fed into the third drawing die, the wall thickness $AD_a-ID_a$ of the outer tube fed into the third drawing die and the tool dimension $ID_z$ of the inner tool surface of the third drawing die is $$ID_z = AD_i + 2*(AD_a - ID_a) - AW,$$

wherein AW is the reduction value.

In a further embodiment of the disclosure, it shall be considered that by the drawing of the inner tube and the outer tube together through the third drawing die also a deformation in a region of the inner surface of the outer tube or of the outer surface of the inner tube is caused such that it is required not to make one or more grooves being drawn in these surfaces smaller by the drawing in order to enable inserting of a signal line and/or a sensor. This in particular holds when the signal line and/or the sensor are placed in the groove prior to the drawing through the third drawing die.

Thus in an embodiment of the disclosure, the reduction value AW amounts to at most 1.0 mm. In a further embodiment, the reduction value amounts to at most 0.6 mm. In yet another embodiment, the reduction value amounts to at most 0.4 mm.

In order to avoid an overdue reduction of the dimensions of the groove during the drawing through the third drawing die in an embodiment of the disclosure during the drawing through the third drawing die the outer dimension of the inner tube is reduced by less than 1 mm. In a further embodiment the outer dimension of the inner tube is reduced by less than 0.5 mm.

In an embodiment of the disclosure prior to the step of inserting the inner tube into the outer tube at least a signal line and/or a sensor are placed in the groove. In a single groove a plurality of signal lines can be inserted and once a plurality of grooves is provided in the outer tube and/or in the inner tube in each groove one or a plurality of signal lines may be inserted.

A signal line in the sense of the present application is understood as any line being able to transmit a signal, i.e. information, from a transmitter to a receiver. Though, in an embodiment, the signal line is chosen from a group consisting of a line for an electrical signal, a line for an electromagnetic signal, a line for an optical signal and a combination thereof.

An example for such a signal line is an isolated electrically conductive wire or an optical glass fiber.

While the sections projecting outwardly or inwardly on the outer tool surface of the mandrel or on the inner tool surface of the drawing die may comprise an arbitrary profile in an embodiment of the disclosure, the cross sectional profile of the respective projecting section has the shape of a divided circle. Such a divided circular groove has the advantage that the corresponding tool can easily be manufactured which has a long tool life.

In an embodiment of the disclosure, the groove comprises a width in a circumferential direction of the outer tube or of the inner tube and a depth in a radial direction of the outer tube or of the inner tube, wherein the width is equal to or smaller or larger than the depth. The corresponding tool forming a negative of the groove has a high stability. Thereby the extension of the groove in the outer surface or in the inner surface along the contour of the outer surface or the inner surface is understood as the width in the circumferential direction.

It shall be understood that for a tube having a circular cross section the width is measured along the circumference of the surface in which the groove is recessed. Correspondingly, the depth of the groove is measured in a radial direction. For a tube having a circular cross section this radial direction extends in the direction of the radius of the tube.

In order not to weaken the finished tube by the grooves in one of its components, in an embodiment of the disclosure prior to the step of inserting the inner tube into the outer tube at least the outer tube is worked by metal cutting such that at least a recess is provided in the inner surface of the outer tube, wherein the recess connects to at least one groove or the inner tube is worked by metal cutting such that at least one recess in the outer surface of the inner tube is formed, wherein the recess connects to at least one groove. In this way, a space to accommodate in particular a sensor is provided at points in the longitudinal direction of the tube, i.e. at one or more positions in the longitudinal direction of the tube. This way the width of the groove may be smaller.

In an embodiment of the disclosure, the working by metal cutting is carried out by a method chosen from a group consisting of milling, drilling, filing and a combination thereof.

In an embodiment of the disclosure, a sensor is placed in the groove and/or in the recess prior to the step of inserting the inner tube into the outer tube. The sensor is connected to a signal line, which is placed in the groove.

In an embodiment, a recess connects to a groove. The recess connecting to the groove in the sense of the present disclosure means that the groove and the recess in the outer surface or in the inner surface provide a continuous available space or a continuous volume.

In an embodiment of the disclosure, the recess comprises a depth in a radial direction of the outer tube or of the inner tube, wherein the depth of the recess is equal to a depth of the groove in the radial direction of the outer tube or of the inner tube.

In an embodiment of the disclosure, the sensor is chosen from a group consisting of an acceleration sensor, a vibration sensor, a conductivity sensor, a pressure sensor, a temperature sensor, a strain gauge, a corrosion sensor, a magnetic field sensor, a heat flux sensor, a torque sensor and a combination thereof.

In an embodiment of the disclosure, the signal line and/or the sensor are glued into the groove and/or the recess by the aid of an adhesive. Such a gluing fixes the sensor and the signal line in the groove and/or in the recess during inserting of the inner tube into the outer tube and during drawing.

While the groove can be provided over the entire length of the tube by drawing, recesses in an embodiment of the disclosure may only be provided at positions in a longitudinal direction of the tube at which sensors must be located. This way the time required for working by metal cutting can be reduced.

Furthermore, at least one of the above aspects is solved by a tube of metal having a seamless or welded outer tube of metal and a seamless or welded inner tube of metal extending in the outer tube, wherein the outer tube and the inner tube over their entire length comprise a force-fit and at least the outer tube comprises at least one groove extending over an entire length of the outer tube in an inner surface of the outer tube or the inner tube comprises at least one groove extending over an entire length of the inner tube in an outer surface of the inner tube.

In an embodiment of the disclosure, a signal line is located at least in the groove of the outer tube or of the inner tube.

In an embodiment of the disclosure, at least in the inner surface of the outer tube or in the outer surface of the inner tube at least one recess is provided, wherein at least one groove connects to the recess. In a further embodiment, the sensor connected to the signal line is located in the groove and/or the recess.

As far as aspects of the disclosure have been described with respect to the method for manufacturing a tube of metal, these aspects also apply to a tube of metal manufactured by this method. As far as the described tube of metal comprises features, these features may be provided by adapting the method for manufacturing the tube.

Furthermore, at least one of the above objects is solved by a system comprising a seamless or welded outer tube of metal and a seamless or welded inner tube of metal extending in the outer tube, wherein the outer tube and the inner tube are force-fitted over their entire length, at least the outer tube comprises a groove extending in an inner surface of the outer tube over the entire length of the outer tube or the inner tube comprises a groove extending in an outer surface of the inner tube over the entire length of the inner tube, and wherein the system furthermore comprises at least one signal line located at least in the groove of the outer tube or of the inner tube.

Further advantages, features and applications of the present disclosure will become apparent from the following description of an embodiment and the corresponding figures.

In the figures, identical elements have been denoted by identical reference numbers.

Figure 1:
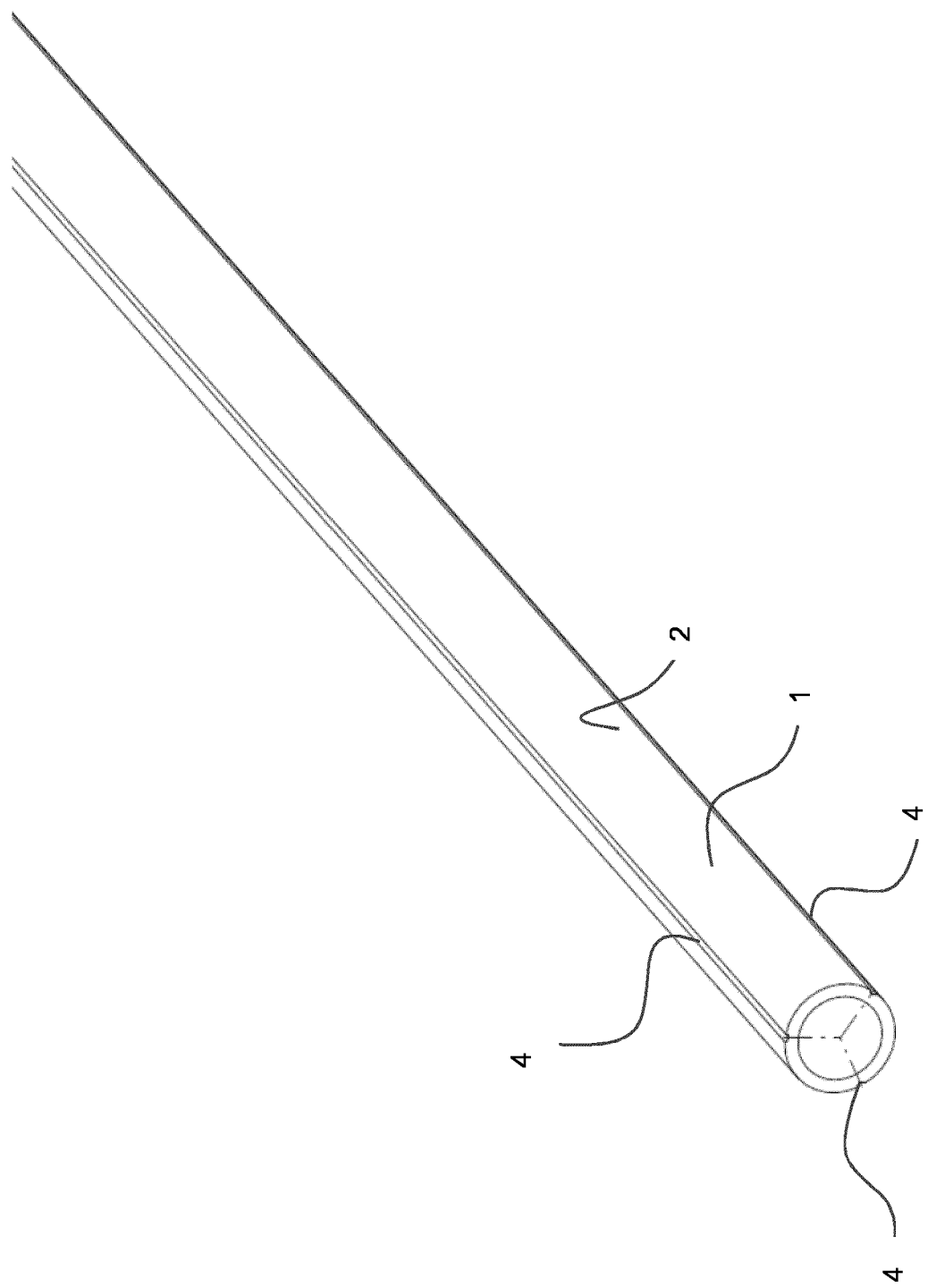
FIG. 1 shows a cutaway perspective view of an inner tube manufactured by the method according to the present disclosure.
Figure 3:
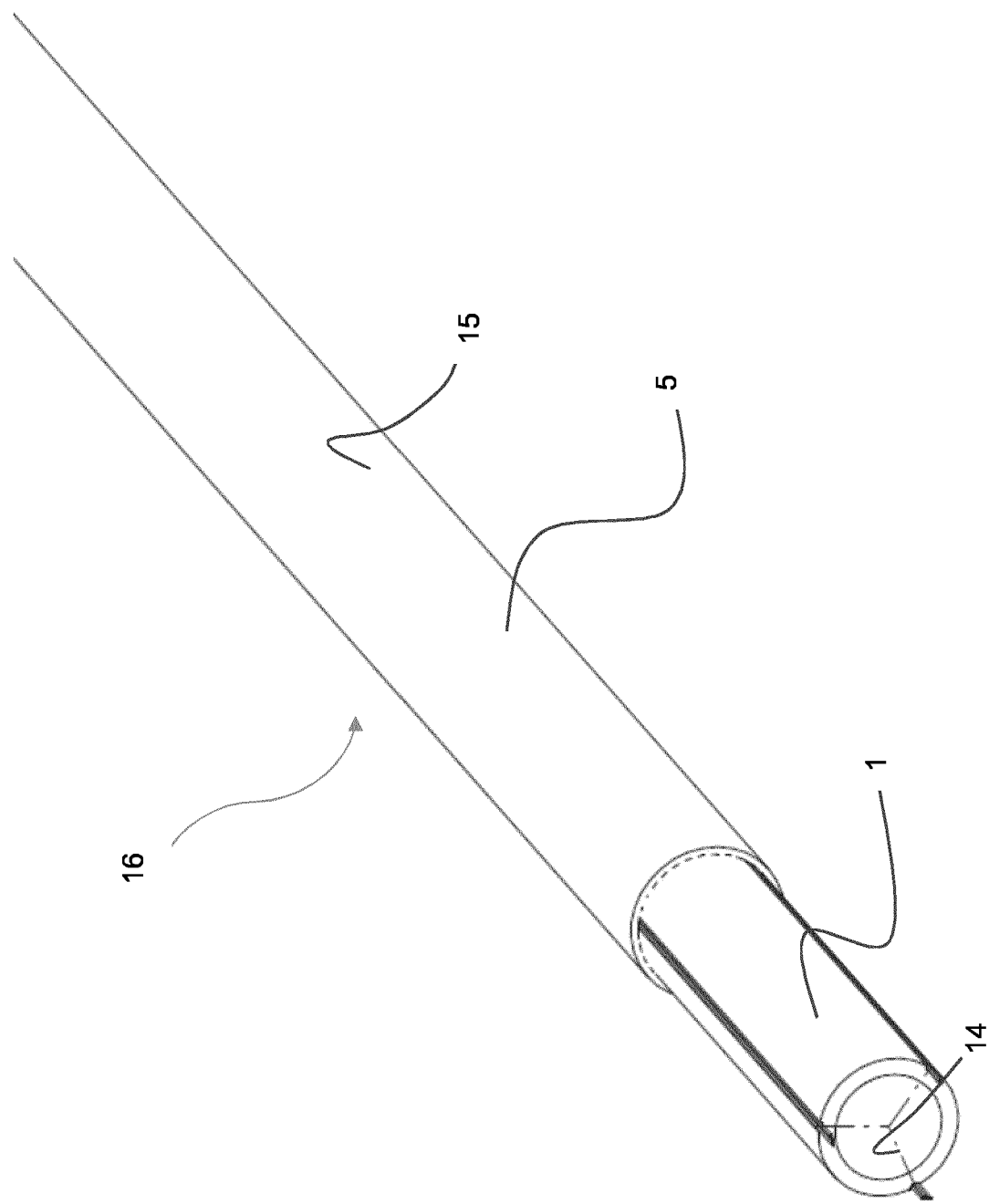
FIG. 3 shows a cutaway perspective view of the inner tube of FIGS. 1 and 2 with an outer tube being concentric to the inner tube, wherein the inner tube and the outer tube have been manufactured by the method according to the disclosure.

FIG. 1 shows an inner tube 1, which comprises three grooves 4 in its outer surface 2. These grooves 4 are provided to accommodate a signal line 7 in a tube manufactured from the inner tube 1 and an outer tube, which in FIG. 3 is denoted by reference number 5.

In the embodiment depicted, the inner tube 1 is a cold formed, in this case a cold-drawn stainless steel tube. While the grooves 4 are placed in the outer surface 2 of the tube 1 by drawing, the recesses 6 in the outer surface 2 of the tube are milled.

Figure 7:
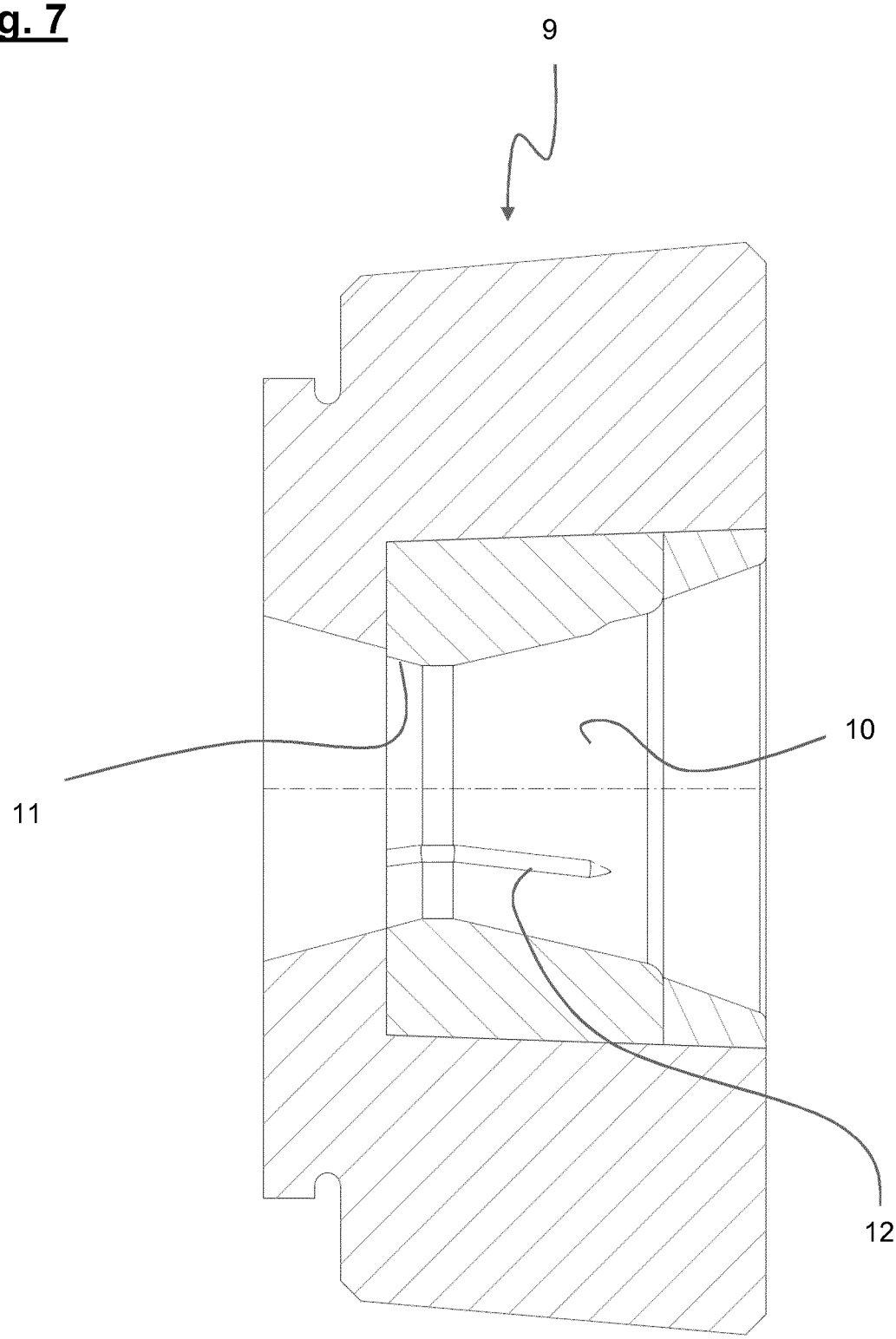
FIG. 7 shows a cross-sectional view in a longitudinal direction of an embodiment of a drawing die to carry out the method according to the disclosure and to manufacture the inner tube of FIGS. 1 to 6.
Figure 8:
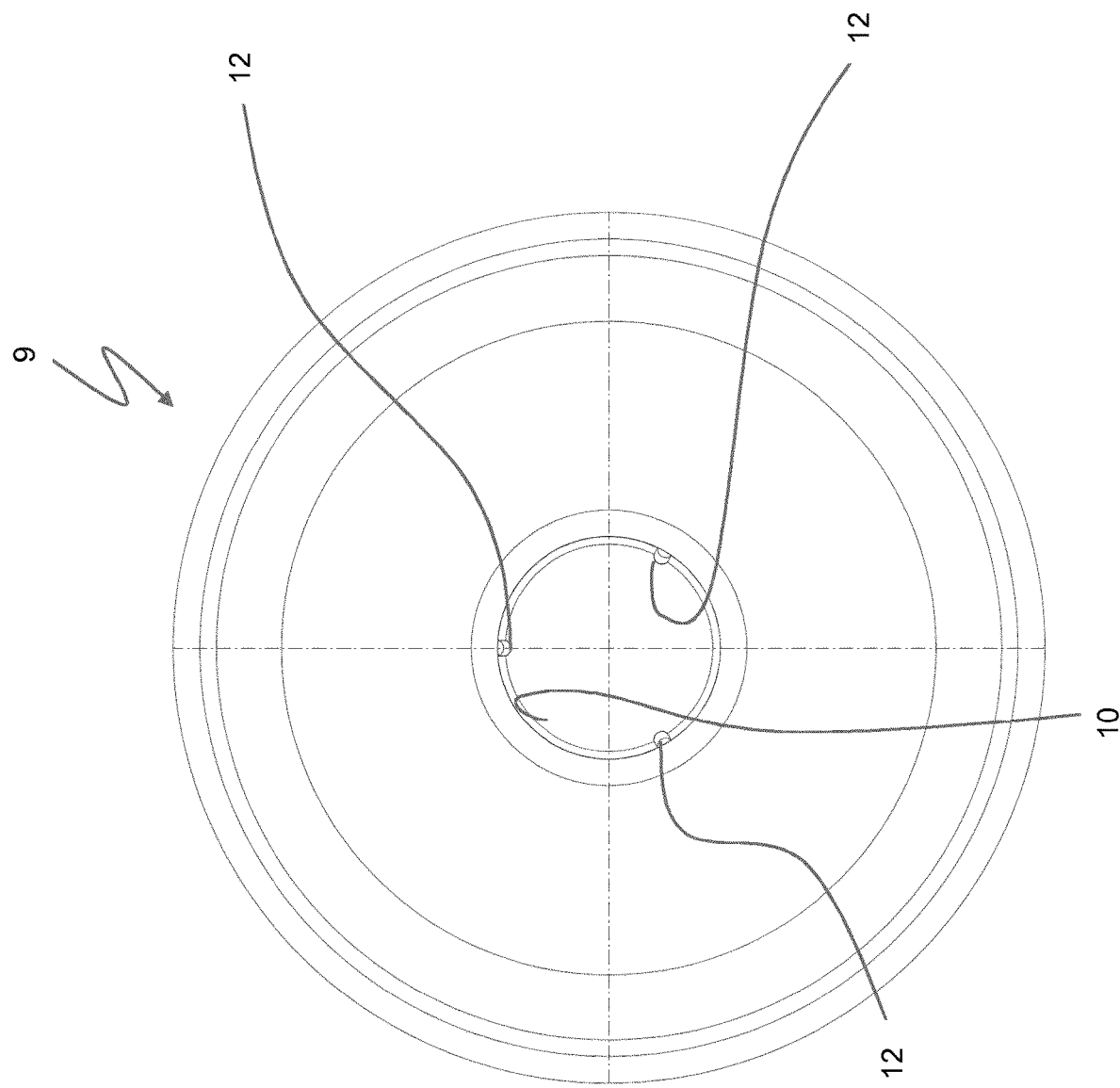
FIG. 8 shows a cross-sectional view in a lateral direction through the drawing die of FIG. 7.

FIGS. 7 and 8 show a drawing die 9 for drawing the inner tube 1. The drawing die 9 reduces the outer diameter hollow fed in such that the readily drawn inner tube 1 comprises an outer diameter which is defined by the tool dimension of the drawing die 9. In this case, the tool dimension in the sense of the present application denotes the smallest diameter of the conical inner tool surface 10. This smallest inner diameter of the drawing die 9 of FIG. 7 is reached at the position denoted by 11. In addition to the drawing die 9, a mounted or floating mandrel may be used for drawing the hollow into the finished tube 1 defining the inner dimension, i.e. the inner diameter of the inner tube 1. However, this is not obligatory.

Figure 4:
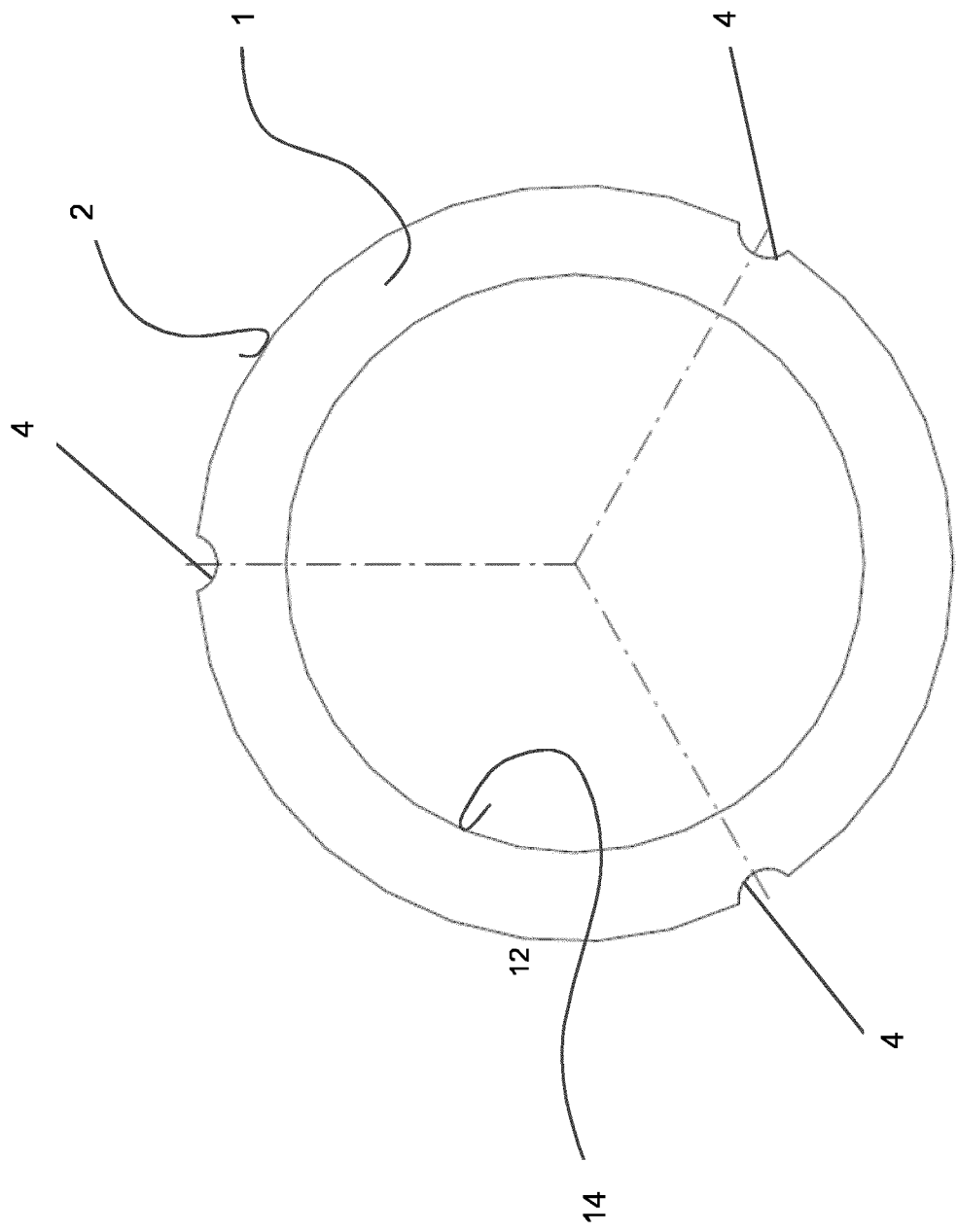
FIG. 4 shows a top view onto the end face of the inner tube of FIGS. 1 to 3.

FIG. 4 shows a cross-section through the inner tube 1 in an arbitrary plane outside the recess 6. The inner surface of the inner tube 1 is denoted by reference number 14.

For drawing of the grooves 4 in the outer surface 2 of the inner tube 1, three projecting sections 12 are provided on the inner tool surface. These sections 12 projecting inwardly from the inner tool surface are distanced from each other by 120° each in a circumferential direction. Each of the sections projecting inwardly comprises a cross-section having the shape of a divided circle, wherein with reference to the inner tool surface 10, the divided circle of each of the sections projecting inwardly is smaller than 180°. This way, the grooves drawn by the drawing die 9 in the outer surface 2 of the inner tube 1 have a width in a circumferential direction of the tube 1 being smaller than their depth in a radial direction of the tube 1.

After drawing through the drawing die 9, the inner tube 1 thus not only comprises its outer dimension and its inner dimension, but shows three grooves each being distant from the next groove by 120°.

The drawing die 9 of FIGS. 7 and 8 in the sense of the present application is also denoted as the second drawing die.

After the drawing of the inner tube 1, additional recesses 6 are milled in its outer surface 2 such that the recesses 6 connect to the grooves 4.

Figure 2:
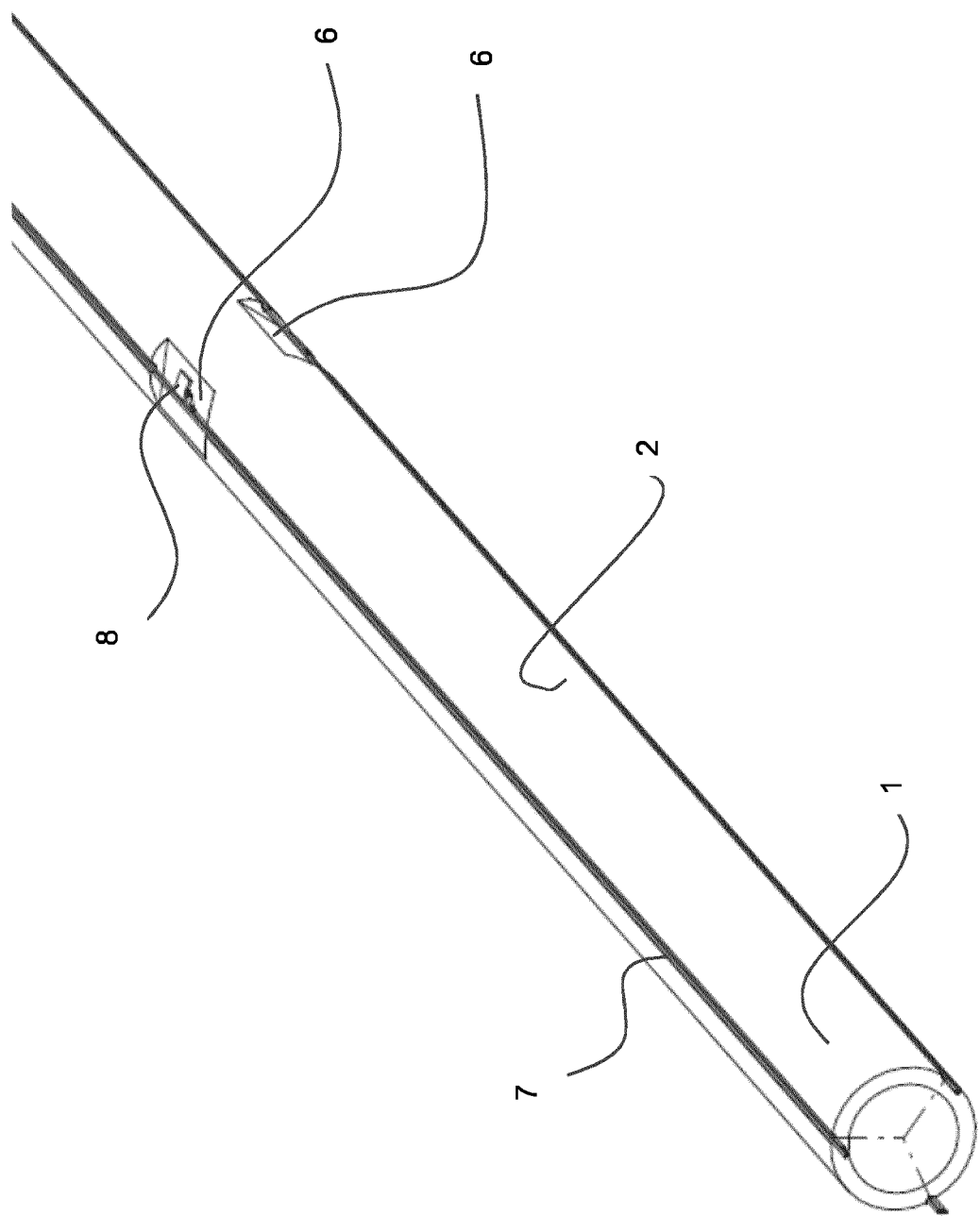
FIG. 2 shows a cutaway perspective view of the inner tube of FIG. 1 with signal lines and sensors located thereon.
Figure 5:
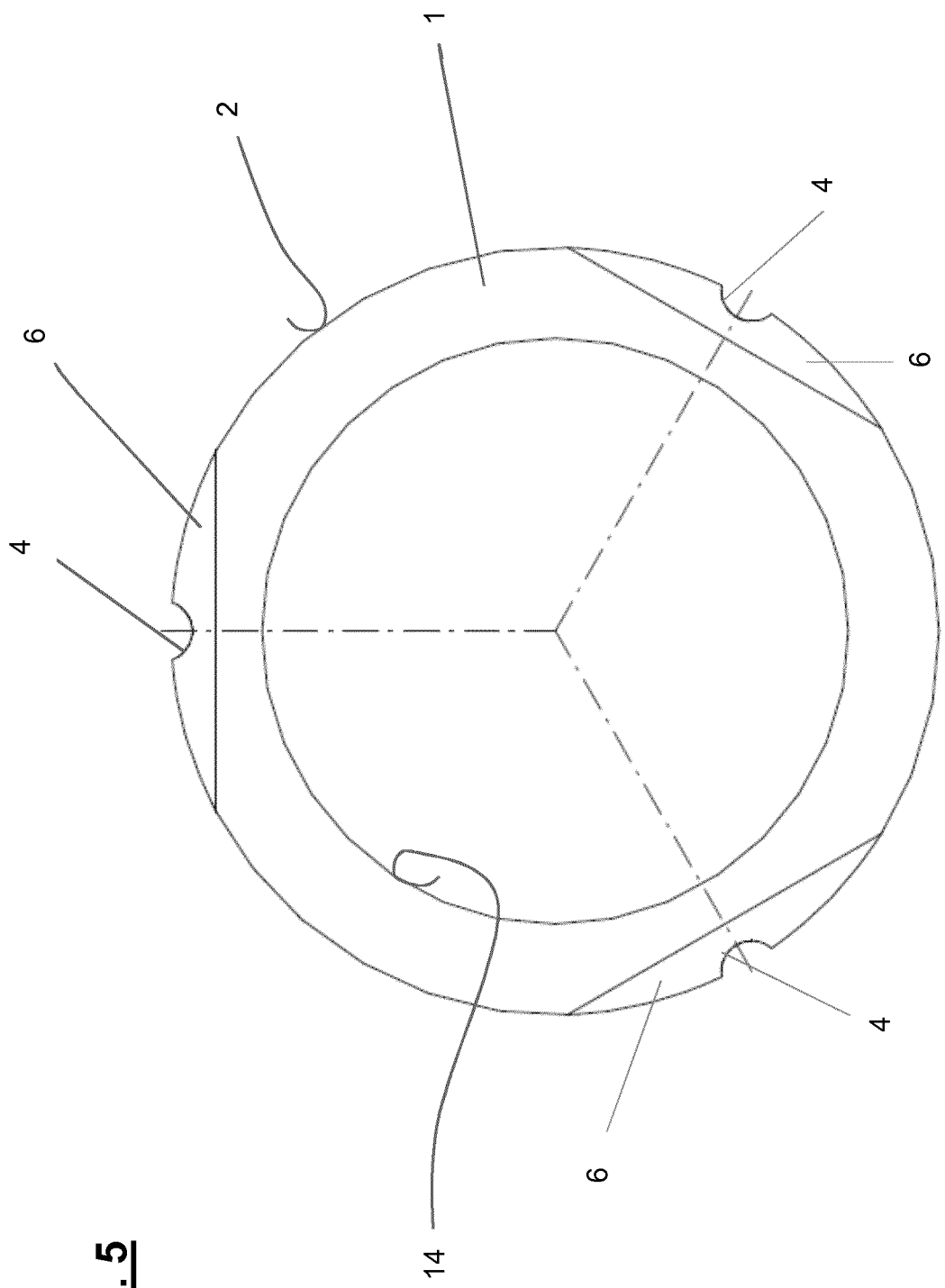
FIG. 5 shows a cross-sectional view of the inner tube of FIGS. 1 to 3 in a plane in which the sensor is located.

FIG. 5 shows a cross-sectional view of the tube in an area of the recess 6. In addition, FIG. 2 shows the inner tube with the already milled recesses 6.

Furthermore, in the outer surface 2 of the inner tube 1, three recesses 6 are provided to accommodate a sensor each being connected to a single line 7 each. Only two of the three recesses 6 are visible in the perspective view of FIG. 2, the third one is hidden by the tube 1.

Each of the recesses 6 connects to one groove 4 in the sense that the groove 4 and the recess 6 form a continuous accommodation space for the signal lines 7 and for the sensors 8.

Next, the signal lines 7 together with the sensors 8 are glued in the grooves 4 and the recesses 6, respectively. With respect to this gluing, it is only relevant that the gluing is sufficiently stable in order to enable insertion of the inner tube 1 into the outer tube 5. In the shown embodiment, the grooves 4 are dimensioned such that they accommodate two signal lines 7 each.

Initially, in order to manufacture the complete tube, it is irrelevant how the outer tube 5 is manufactured or provided. Typically, the outer tube 5 will be a cold formed tube of stainless steel.

It is crucial that the outer dimension of the inner tube 1 is smaller than the inner dimension of the outer tube 5. In this way, the inner tube 1 with low friction at the outer tube 5 can be inserted with a small force into the outer tube 5. Once the inner tube 1 and the outer tube 5 comprise a friction being too high when inserting the inner tube 1 into the outer tube 5, the signal lines 7 and sensors 8 already placed in the grooves 4 and in the recesses 6 may be damaged.

Then the inner and outer tubes 1, 5 located concentrically in each other are mechanically and force-fittingly joined to a tube 16 by drawing both tubes together on a drawing bench through a drawing die. This drawing die in the sense of the present application is denoted as the third drawing die. The third drawing die comprises a design corresponding to the design of the drawing die of FIGS. 7 and 8, wherein the third drawing die does not comprise projecting sections on the shaping inner tool surface. It is crucial for this step of a method for manufacturing the tube that the inner diameter of the outer tube 5 is reduced such that the inner surface of the outer tube 5 sits on the outer surface 2 of the inner tube 1. In doing so, the tool dimension, i.e. the minimum tool diameter, $ID_z$ of the inner tool surface is chosen such that $$ID_z = AD_i + 2*(AD_a - ID_a) - AW$$

is fulfilled, wherein $AD_i$ is the outer dimension of the inner tube fed into the third drawing die, $AD_a - ID_a$ is the wall thickness of the incoming outer tube, and $AW$ is the reduction value.

In the shown embodiment, the outer dimension of the incoming inner tube 1 prior to the drawing through the third drawing die amounts to 25.4 mm and the wall thickness of the incoming inner tube amounts to 3 mm. The wall thickness of the incoming outer tube amounts to 1 mm and the reduction value amounts to 0.1 mm. Thereof, a tool dimension of 27.3 mm has been derived.

In the shown embodiment, the divided circle forming the groove 4 has a radius of 0.5 mm. The divided circle is recessed in the outer surface 2 of the inner tube 1 such that the width of the groove measured as a connecting line between the two edges in a direction perpendicular to the longitudinal axis of the inner tube 1 amounts to 1.88 mm. The depth of the groove 4 in this embodiment amounts to 0.7 mm measured between the point of the groove having the greatest depth and the connecting line between the two edges of the groove on the outer surface 2 and perpendicular to this connecting line.

Figure 6:
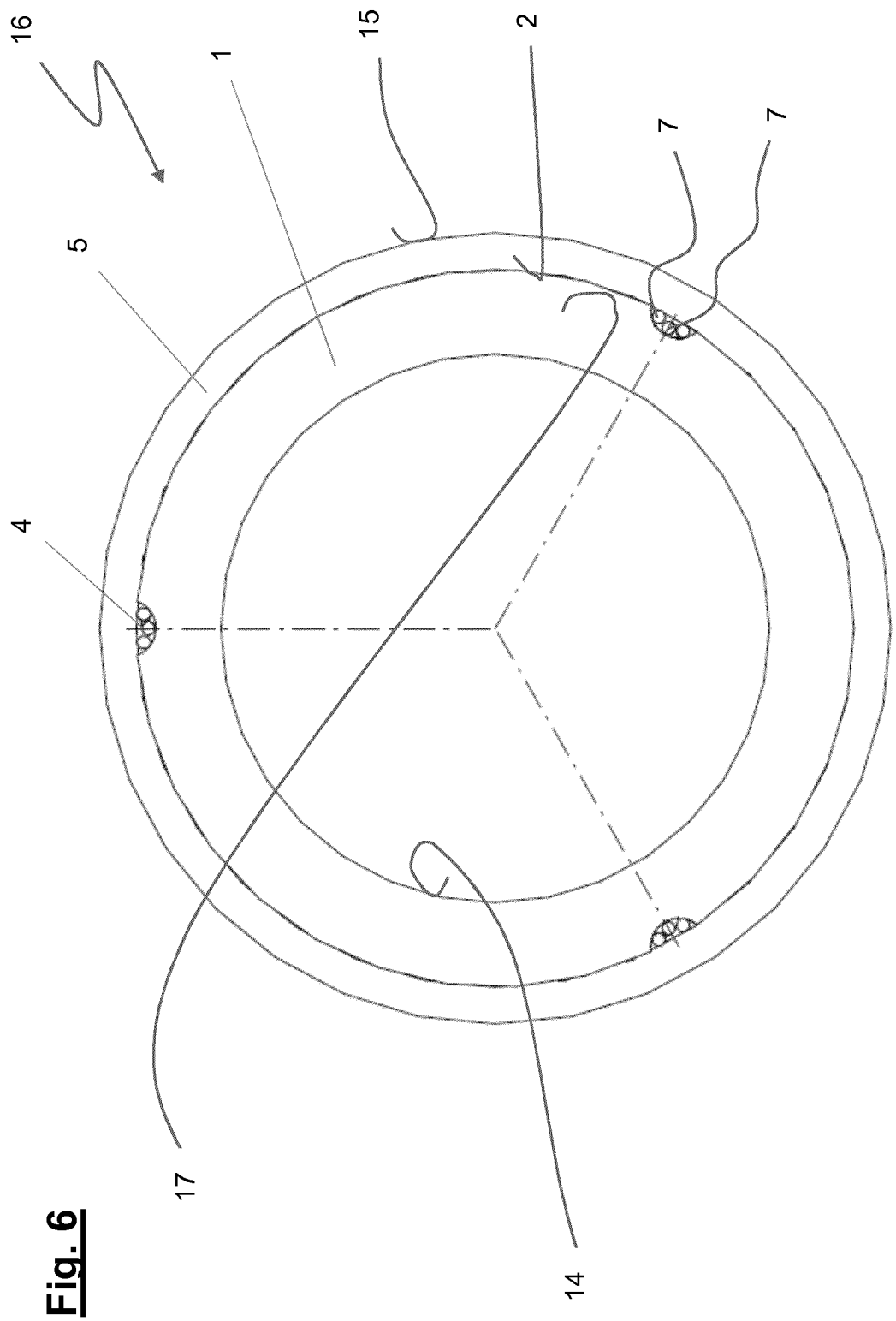
FIG. 6 shows a cross-sectional view through the tube with the inner tube and the outer tube of FIG. 3 in a plane in which a sensor is located.

FIG. 6 shows a cross-sectional view of the completed tubes of FIG. 3 after drawing of the inner tube 1 and the outer tube 5 through the third drawing die. It is to be noted that the outer surface 2 of the inner tube 1 contacts the inner surface 14 of the outer tube 5.

The outer surface of the outer tube 5 in the figures is denoted by reference number 15.

In the shown embodiment, the second drawing die comprises a tool dimension, i.e. a minimum tool diameter of 27.3 mm. The outer diameter of the outer tube entering into the third drawing die amounts to 30 mm with a wall thickness of 1 mm.

Figure 9:
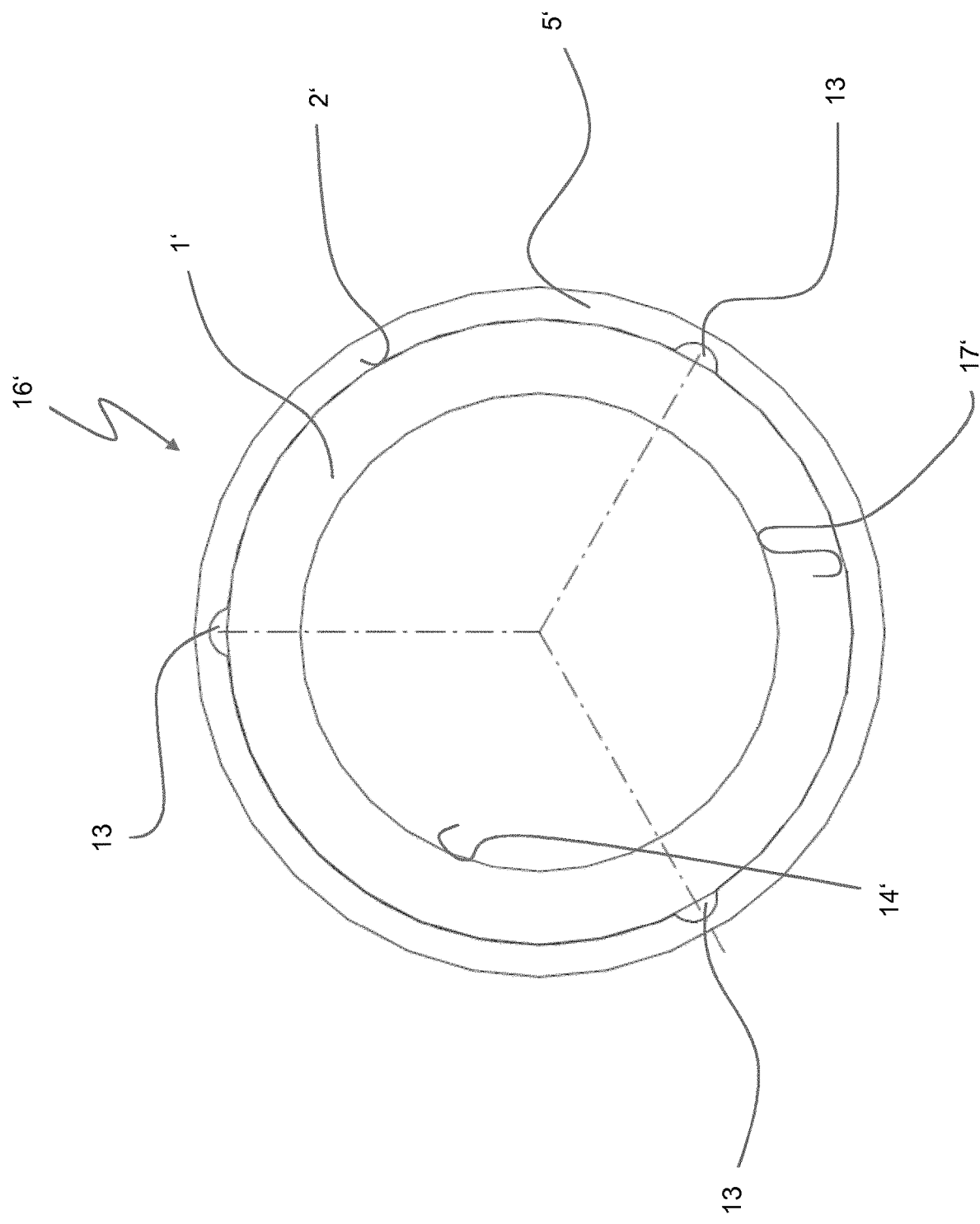
FIG. 9 shows a cross-sectional view of an alternative embodiment of a tube manufactured by an embodiment of the method according to the disclosure.

FIG. 9 shows an embodiment of a tube 16' according to the disclosure, wherein the inner tube 1' has an outer surface 2' without grooves and recesses. Instead, three grooves 13 are drawn into the outer tube 5' mounted onto the inner tube 1'. For this purpose, the outer tube has been drawn of a hollow, wherein as a tool a drawing die and a mounted mandrel have been used. This drawing die forms the first drawing die in the sense of the present application.

The mandrel 2 on its tool surface defining the inner surface of the outer tube comprises three sections projecting outwardly to draw the grooves 13 in the inner surface of the outer tube. In addition, it is possible that also in the inner surface 17' of the outer tube 5', recesses are provided in which sensors can be placed. These recesses can be inserted in the inner surface 17' by milling.

Figure 10:
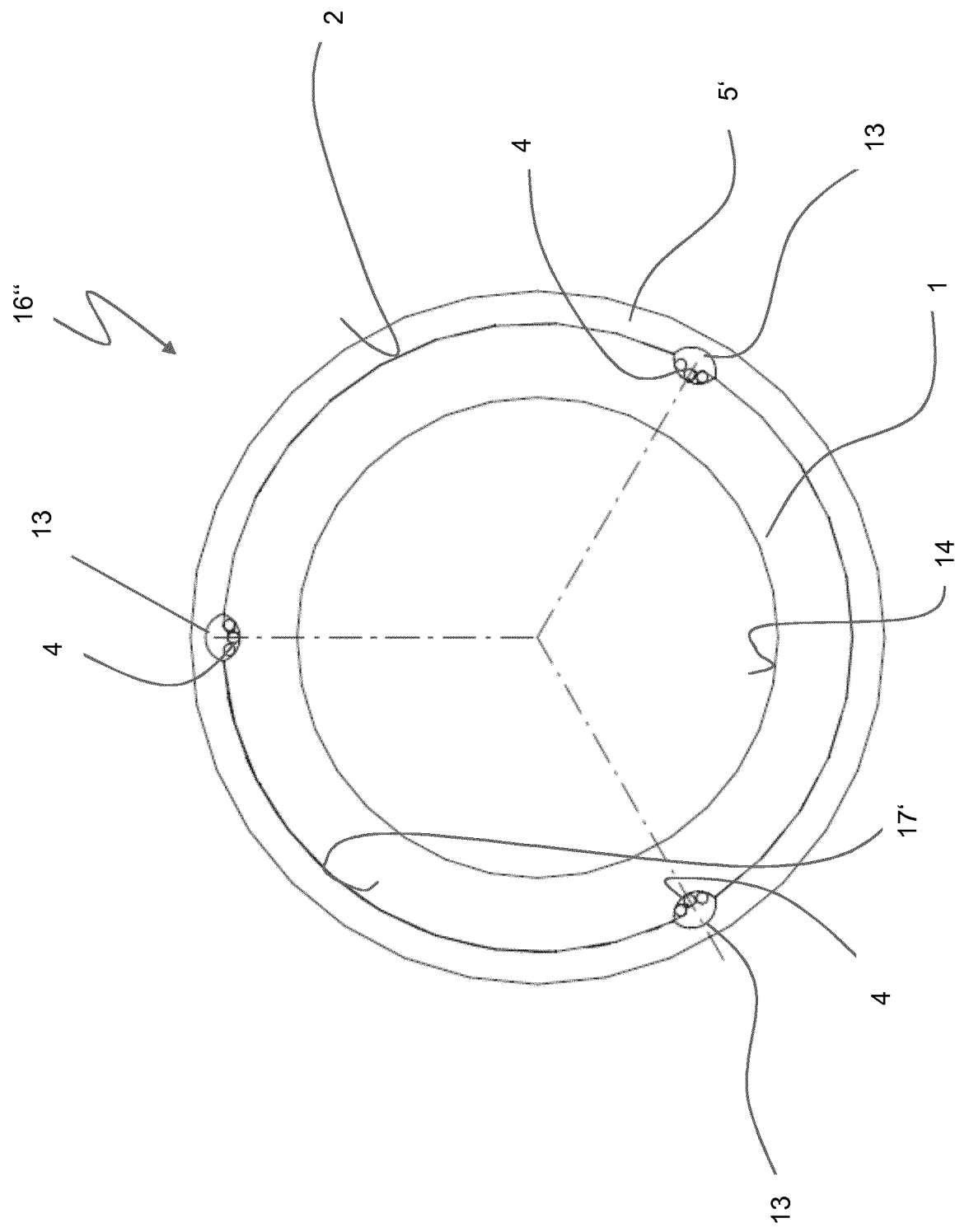
FIG. 10 shows a cross-sectional view of a further embodiment of a tube manufactured by a method according to the present disclosure.

FIG. 10 shows a schematic cross-section through a tube 16". In this embodiment of the tube 16", the inner surface 17' of the outer tube 5' as well as the outer surface 2 of the inner tube 1 each comprise four grooves 4, 13. The grooves 4 of the inner tube 1 and the grooves 13 of the outer tube 5' have been manufactured as it has been described for the inner tube 1 of FIGS. 1 to 5 and for the outer tube 5' of FIG. 9. The grooves 4, 13 are located such that they define a common space.

For purposes of the original disclosure, it is noted that all features become apparent for a person skilled in the art from the present description, the figures and the claims even if they have only been described with reference to particular further features and can be combined either on their own or in arbitrary combinations with other features or groups of features disclosed herein as far as such combinations are not explicitly excluded or technical facts exclude such combinations or make them useless. An extensive, explicit description of each possible combination of features has only been omitted in order to provide a short and readable description. While the disclosure has been shown in detail in the figures and the above description, this description is only an example and is not considered to restrict the scope of protection as it is defined by the claims. The disclosure is not restricted to the disclosed embodiments.

Modifications to the disclosed embodiments are apparent for a person skilled in the art from the drawings, the description and the attached claims. In the claims, the word "comprising" does not exclude other elements or steps and the undefined article "a" does not exclude a plurality. The mere fact that some features have been claimed in different claims does not exclude their combination. Reference numbers in the claims are not considered to restrict the scope of protection.

REFERENCE LIST 1, 1' inner tube
2, 2' outer surface of the inner tube
4 groove in the outer surface of the inner tube
5, 5' outer tube
6 recess
7 signal line
8 sensor
9 third drawing die
10 inner tool surface of the drawing die
11 tool dimension
12 projecting section of the inner tool surface
13 groove in the inner surface of the outer tube
14, 14' inner surface of the inner tube
15 outer surface of the outer tube
16, 16', 16" tube
17, 17' inner surface of the outer tube

The invention claimed is:

1. A tube of metal comprising:
a seamless or welded outer tube of metal; and
a seamless or welded inner tube of metal extending in the outer tube,
wherein the outer tube and the inner tube are concentrically located and are force-fitted over an entire longitudinal length of the tube of metal, and
wherein (i) the outer tube comprises a groove extending in an inner surface of the outer tube over the entire length of the outer tube or (ii) both the outer tube comprises a groove extending in an inner surface of the outer tube over the entire length of the outer tube and the inner tube comprises a groove extending in an outer surface of the inner tube over the entire length of the inner tube.

2. The tube according to claim 1, wherein a signal line is located in the groove of the outer tube or in the groove of the inner tube.

3. The tube according to claim 2, wherein the signal line is chosen from a group consisting of a line for an electrical signal, a line for an electromagnetic signal, a line for an optical signal and a combination thereof.

4. The tube according to claim 1, wherein at least a recess is provided in at least the inner surface of the outer tube or in the outer surface of the inner tube,
wherein the recess connects to at least one groove, and
wherein a sensor connected to a signal line is located at least partly in the recess.

5. A system comprising;
a seamless or welded outer tube of metal; and
a seamless or welded inner tube of metal extending in the outer tube,
wherein the outer tube and the inner tube are concentrically located and are force-fitted over their an entire longitudinal length of the tube of metal length,
wherein (i) the outer tube comprises a groove extending in an inner surface of the outer tube over the entire length of the outer tube or (ii) both the outer tube comprises a groove extending in an inner surface of the outer tube over the entire length of the outer tube and the inner tube comprises a groove extending in an outer surface of the inner tube over the entire length of the inner tube, and
wherein the system furthermore comprises at least one signal line located in at least one of the groove of the outer tube or of the inner tube.

6. A tube of metal comprising:
an outer tube of metal; and
an inner tube of metal;
wherein the outer tube is concentric to the inner tube,
wherein the outer tube and inner tube are force-fitted over an entire longitudinal length of the tube of metal, and
wherein the outer tube comprises a first groove extending in an inner surface of the outer tube over an entire longitudinal length of the outer tube and the inner tube comprises a second groove extending in an outer surface of the inner tube over an entire longitudinal length of the inner tube.

7. The tube according to claim 6, wherein a signal line is located in at least one of the first groove of the outer tube and the second groove of the inner tube.

8. The tube according to claim 7, wherein the signal line is chosen from a group consisting of a line for an electrical signal, a line for an electromagnetic signal, a line for an optical signal and a combination thereof.

9. The tube according to claim 6, wherein at least a recess is provided in at least the inner surface of the outer tube or the outer surface of the inner tube,
- wherein the recess connects to at least one of the first groove of the outer tube and the second groove of the inner tube, and
- wherein a sensor connected to a signal line is located at least partly in the recess.

10. The tube according to claim 9, wherein the sensor is chosen from a group consisting of an acceleration sensor, a vibration sensor, a conductivity sensor, a pressure sensor, a temperature sensor, a strain gauge, a corrosion sensor, a magnetic field sensor, a heat flux sensor and a torque sensor or any combination thereof.

11. The tube according to claim 10, wherein the signal line is chosen from a group consisting of a line for an electrical signal, a line for an electromagnetic signal, a line for an optical signal and a combination thereof.

12. The tube according to claim 6, wherein the first groove and the second groove are located so as to define a common space.

13. The tube according to claim 6, wherein the outer tube of metal is seamless or welded, and wherein the inner tube of metal is seamless or welded.

14. The tube according to claim 13, wherein the outer tube of metal and the inner tube of metal are formed from different materials.

15. The tube according to claim 13, wherein the outer tube of metal and the inner tube of metal are formed from identical materials.

16. A tube of metal comprising:
- an outer tube of metal;
- an inner tube of metal; and
- a signal line,
- wherein the outer tube is concentric to the inner tube,
- wherein the outer tube and inner tube are force-fitted over an entire longitudinal length of the tube of metal, and
- wherein both the outer tube comprises a plurality of first grooves extending in an inner surface of the outer tube over an entire longitudinal length of the outer tube and the inner tube comprises a plurality of second grooves extending in an outer surface of the inner tube over an entire longitudinal length of the inner tube,
- wherein the signal line is located in at least one groove of the plurality of first grooves and the plurality of second grooves, and
- wherein the signal line is chosen from a group consisting of a line for an electrical signal, a line for an electromagnetic signal, a line for an optical signal and a combination thereof.

17. The tube according to claim 16, wherein at least a recess is provided in at least the inner surface of the outer tube or the outer surface of the inner tube,
- wherein the recess connects to at least one of the first groove of the outer tube and the second groove of the inner tube, and
- wherein a sensor connected to a signal line is located at least partly in the recess.

18. The tube according to claim 17, wherein the sensor is chosen from a group consisting of an acceleration sensor, a vibration sensor, a conductivity sensor, a pressure sensor, a temperature sensor, a strain gauge, a corrosion sensor, a magnetic field sensor, a heat flux sensor and a torque sensor or any combination thereof.

* * * * *